US009478741B2

(12) United States Patent
Hsu

(10) Patent No.: US 9,478,741 B2
(45) Date of Patent: Oct. 25, 2016

(54) RESISTIVE RANDOM ACCESS MEMORY AND METHOD FOR MANUFACTURING THE SAME

(71) Applicant: Powerchip Technology Corporation, Hsinchu (TW)

(72) Inventor: Mao-Teng Hsu, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/064,610

(22) Filed: Mar. 9, 2016

(65) Prior Publication Data

US 2016/0190444 A1 Jun. 30, 2016

Related U.S. Application Data

(62) Division of application No. 14/562,778, filed on Dec. 8, 2014, now Pat. No. 9,318,703.

(30) Foreign Application Priority Data

Sep. 22, 2014 (TW) .............................. 103132631 A

(51) Int. Cl.
*H01L 27/24* (2006.01)
*H01L 45/00* (2006.01)

(52) U.S. Cl.
CPC ....... *H01L 45/1616* (2013.01); *H01L 27/2436* (2013.01); *H01L 27/2463* (2013.01); *H01L 27/2481* (2013.01); *H01L 45/04* (2013.01); *H01L 45/1233* (2013.01); *H01L 45/1253* (2013.01); *H01L 45/146* (2013.01); *H01L 45/1675* (2013.01); *H01L 45/1683* (2013.01)

(58) Field of Classification Search
CPC .. H01L 27/2481; H01L 27/249; H01L 45/16
See application file for complete search history.

(56) References Cited

U.S. PATENT DOCUMENTS

| 7,983,065 | B2 * | 7/2011 | Samachisa | ............. B82Y 10/00 365/130 |
| 9,318,703 | B2 * | 4/2016 | Hsu | ...................... H01L 27/2436 |
| 9,349,953 | B2 * | 5/2016 | Tu | .......................... H01L 45/146 |
| 2010/0259960 | A1 | 10/2010 | Samachisa | |

FOREIGN PATENT DOCUMENTS

| TW | 200305166 | 10/2003 |
| TW | 200514094 | 4/2005 |
| TW | 200739881 | 10/2007 |
| TW | 200941640 | 10/2009 |

OTHER PUBLICATIONS

Office Action of Taiwan Counterpart Application, issued on Jul. 26, 2016, p. 1-p. 5, in which the listed reference was cited.

* cited by examiner

*Primary Examiner* — Mark Prenty
(74) *Attorney, Agent, or Firm* — Jianq Chyun IP Office

(57) ABSTRACT

A resistive random access memory (RRAM) including a substrate, a dielectric layer, memory cells and an interconnect structure is provided. The dielectric layer is disposed on the substrate. The memory cells are vertically and adjacently disposed in the dielectric layer, and each of the memory cells includes a first electrode, a second electrode and a variable resistance structure. The second electrode is disposed on the first electrode. The variable resistance structure is disposed between the first electrode and the second electrode. In two vertically adjacent memory cells, the first electrode of the upper memory cell and the second electrode of the lower memory cell are disposed between the adjacent variable resistance structures and isolated from each other. The interconnect structure is disposed in the dielectric layer and connects the first electrodes of the memory cells.

11 Claims, 5 Drawing Sheets

RESISTIVE RANDOM ACCESS MEMORY AND METHOD FOR MANUFACTURING THE SAME

CROSS-REFERENCE TO RELATED APPLICATION

This application is a divisional application of and claims the priority benefit of a prior application Ser. No. 14/562,778, filed on Dec. 8, 2014, now allowed. The prior application Ser. No. 14/562,778 claims the priority benefit of Taiwan application serial no. 103132631, filed on Sep. 22, 2014. The entirety of each of the above-mentioned patent applications is hereby incorporated by reference herein and made a part of this specification.

BACKGROUND

1. Field of the Invention

The invention is directed to a memory and a method of manufacturing the same and more particularly, to a resistive random access memory (RRAM) and a method of manufacturing the same.

2. Description of Related Art

Non-volatile memories have an advantage of storing data even when the power is cut off. Hence, most electrical products have to be equipped with such memories for keeping normal operation when being powered on. At present, a resistive random access memory (RRAM) is a type of nonvolatile memory that is being actively developed in the industry. The RRAM has advantages, such as low write-in operation voltage, short write-in erase time, long memorizing time, non-destructive read out, multi-state memory, simple structure, and small required area. Consequently, the RRAM has great potential to become one of the non-volatile memory devices that are widely applied in personal computers and electronic apparatuses in the future.

In order to advance intensity of the memories, the industry currently proposes a high-density three dimensional (3D) RRAM in a vertical arrangement. However, the manufacturing of the current 3D RRAM commonly involves with a deep etching process and a deep filling process and therefore, cannot be directly integrated with an advanced logic device manufacturing process.

SUMMARY

The invention provides a resistive random access memory (RRAM) and a method of manufacturing the same capable of being directly integrated with an advanced logic device manufacturing process.

The invention is directed to an RRAM, including a substrate, a dielectric layer, a plurality of memory cells and an interconnect structure. The dielectric layer is disposed on the substrate. The memory cells are vertically and adjacently disposed in the dielectric layer, and each of the memory cells includes a first electrode, a second electrode and a variable resistance structure. The second electrode is disposed on the first electrode. The variable resistance structure is disposed between the first electrode and the second electrode. In two vertically adjacent memory cells, the first electrode of the upper memory cell and the second electrode of the lower memory cell are disposed between the adjacent variable resistance structures and isolated from each other. The interconnect structure is disposed in the dielectric layer and connects the first electrodes of the memory cells.

According to an embodiment of the invention, in the RRAM, the variable resistance structure includes a variable resistance layer.

According to an embodiment of the invention, in the RRAM, the material of the variable resistance structure includes metal oxide.

According to an embodiment of the invention, in the RRAM, the metal oxide includes hafnium oxide, magnesium oxide, nickel oxide, niobium oxide, titanium oxide, aluminum oxide, vanadium oxide, tungsten oxide, zinc oxide or cobalt oxide.

According to an embodiment of the invention, in the RRAM, the variable resistance structure includes an insulation layer. The insulation layer and the variable resistance layer are stacked together.

According to an embodiment of the invention, in the RRAM, the material of the insulation layer includes oxide.

According to an embodiment of the invention, in the RRAM, the first electrode is a part of the interconnect structure.

According to an embodiment of the invention, the RRAM further includes a transistor. The transistor is disposed on the substrate, and a terminal of the transistor is connected with the interconnect structure.

The invention is directed to a method of manufacturing an RRAM, including the following steps. A dielectric layer is formed on a substrate. A plurality of memory cells is formed in the dielectric layer. The memory cells are vertically and adjacently disposed in the dielectric layer, and each of the memory cells includes a first electrode, a second electrode and a variable resistance structure. The second electrode is disposed on the first electrode. The variable resistance structure is disposed between the first electrode and the second electrode. In two vertically adjacent memory cells, the first electrode of the upper memory cell and the second electrode of the lower memory cell are disposed between the adjacent variable resistance structures and isolated from each other. An interconnect structure is formed in the dielectric layer, where the interconnect structure connects the first electrodes of the memory cells.

According to an embodiment of the invention, in the method of manufacturing the RRAM, the method of forming the dielectric layer includes performing a chemical vapor deposition (CVD) process.

According to an embodiment of the invention, in the method of manufacturing the RRAM, the method of forming the first electrode includes performing a damascene process.

According to an embodiment of the invention, in the method of manufacturing the RRAM, the method of forming each of the variable resistance structures and each of the second electrodes includes the following steps. An opening is formed in the dielectric layer. A conformal variable resistance material layer is formed in the opening. A conductive material layer filling up the opening is formed. The conductive material layer and the variable resistance material layer outside the opening are removed.

According to an embodiment of the invention, in the method of manufacturing the RRAM, the method of forming the opening includes performing a patterning process on the dielectric layer.

According to an embodiment of the invention, in the method of manufacturing the RRAM, the method of forming the variable resistance material layer includes performing a CVD process.

According to an embodiment of the invention, in the method of manufacturing the RRAM, the method of forming the conductive material layer includes performing an electroplating process or a physical vapor deposition (PVD) process.

According to an embodiment of the invention, in the method of manufacturing the RRAM, the method of removing the conductive material layer and the variable resistance material layer outside the opening includes performing a chemical mechanical polishing (CMP) process.

According to an embodiment of the invention, in the method of manufacturing the RRAM, the method of forming each of the variable resistance structures further includes forming a conformal insulation material layer before or after forming the variable resistance material layer.

According to an embodiment of the invention, in the method of manufacturing the RRAM, the method of forming the insulation material layer includes performing a CVD process.

According to an embodiment of the invention, in the method of manufacturing the RRAM, the method of forming the interconnect structure includes performing a damascene process.

According to an embodiment of the invention, the method of manufacturing the RRAM further includes forming a transistor on the substrate before forming the dielectric layer, wherein a terminal of the transistor is connected with the interconnect structure.

To sum up, in the RRAM and the method of forming the same provided by the invention, in the two vertically adjacent memory cells, the first electrode of the upper memory cell and the second electrode of the lower memory cell are disposed between the adjacent variable resistance structures and isolated from each other, and the interconnect structure connects the first electrodes of the memory cells. Due to having the aforementioned structure, the manufacture process of the RRAM does not require a deep etching process or a deep filling process. Thus, the manufacturing process of the RRAM can be directly integrated with an advanced logic device manufacturing process.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
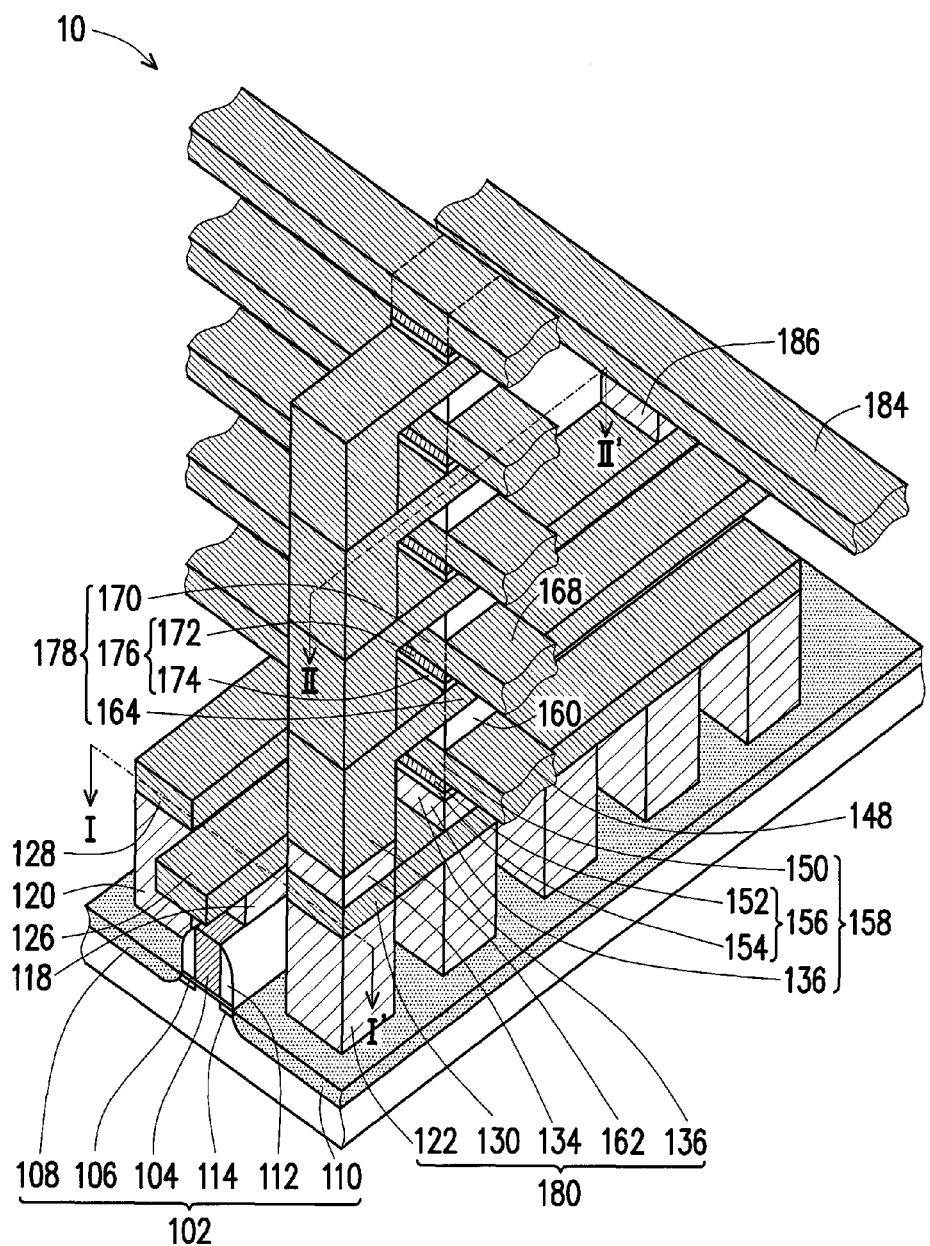
FIG. 1 is a perspective view of a resistive random access memory (RRAM) according to an embodiment of the invention.
Figure 2:
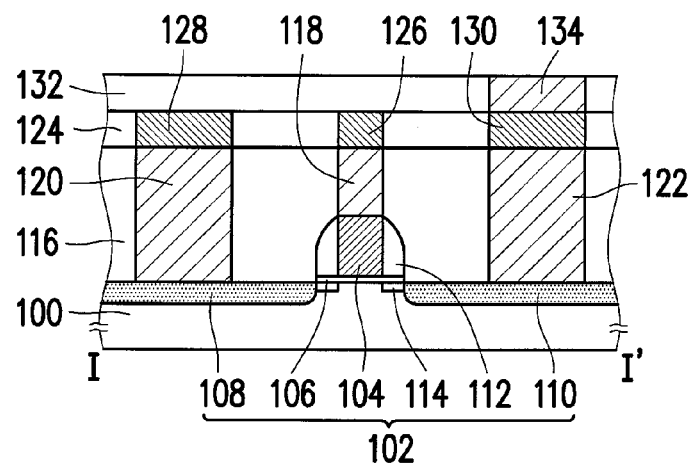
FIG. 2 is a cross-sectional view illustrating a transistor along a section line I-I' in FIG. 1.

FIG. 1 is a perspective view of a resistive random access memory (RRAM) according to an embodiment of the invention. In FIG. 1, only a dielectric layer between two vertically adjacent memory cells and a variable resistance structure between a first electrode and a second electrode are illustrated for a clearer description. FIG. 2 is a cross-sectional view illustrating a transistor along a section line I-I' in FIG. 1. FIG. 3A to FIG. 3D are cross sectional views along a section line II-II' in FIG. 1 which illustrate a flow of a method of manufacturing the RRAM.

Figure 3A:
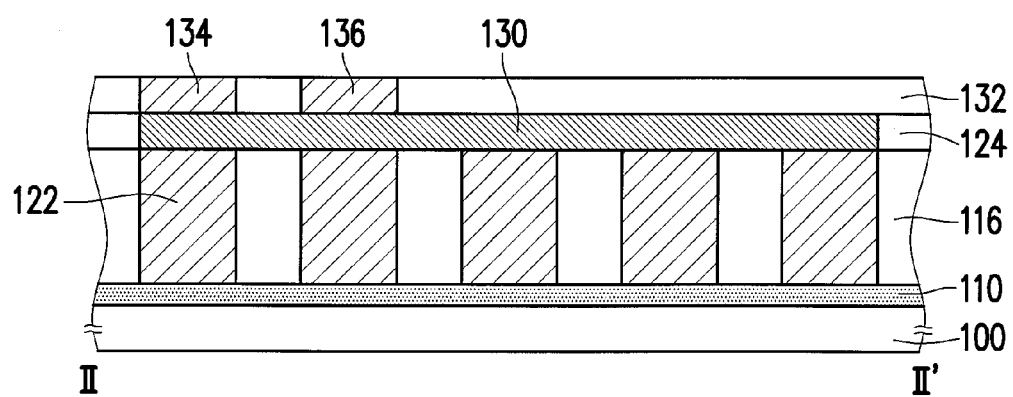
FIG. 3A to FIG. 3D are cross sectional views along a section line in FIG. 1 which illustrate a flow of a method of manufacturing the RRAM.

First, with reference to FIG. 1, FIG. 2 and FIG. 3A, a transistor 102 is selectively formed on a substrate 100. The transistor 102 is, for example, a metal oxide semiconductor field effect transistor (MOSFET) or a bipolar junction transistor (BJT).

In the present embodiment, the transistor 102 is a MOSFET for the purpose of illustration, which is not limited by the invention herein. The transistor 102 includes a gate 104, a gate dielectric layer 106, doped regions 108 and 110, a spacer 112 and a doped extension region 114. The gate dielectric layer 106 is located between the gate 104 and the substrate 100. The doped regions 108 and 110 are respectively located in the substrate 100 at two sides of the gate 104. In the present embodiment, the doped regions 108 and 110 may serve as terminals of the transistor 102. For instance, the doped region 108 may serve as a source, while the doped region 110 may serve as a drain. The spacer 112 is located on the substrate 100 at the two sides of the gate 104. The doped extension region 114 is located in the substrate 100 under the spacer 112 and may serve as a light doped drain (LDD). Since the material and the method of manufacturing each the element in the transistor 102 are well-known to persons of ordinary skill in the art, they are not to be reiterated herein.

Then, a dielectric layer 116 is formed on the substrate 100. The material of the dielectric layer 116 is, for example, silicon oxide. The method of forming the dielectric layer 116 is, for example, a chemical vapor deposition (CVD) process.

Then, conductor layers 118, 120 and 122 are formed in the dielectric layer 116. The conductor layers 118, 120 and 122 are respectively connected with the gate 104 and the doped regions 108 and 110. The conductor layers 118, 120 and 122 are made of, for example, tungsten, copper or aluminum. The conductor layers 118, 120 and 122 may be formed by using an etching process and a deposition process or by utilizing a damascene process.

Next, a dielectric layer 124 is formed on the dielectric layer 116. The material and the method of forming the dielectric layer 124 may refer to those of the dielectric layer 116 described above.

Then, conductor layers 126, 128 and 130 are formed in the dielectric layer 124. The conductor layers 126, 128 and 130 are respectively connected with the conductor layers 118, 120 and 122. The conductor layer 126 may serve as a word line, while the conductor layer 128 may serve as a source line. The conductor layers 126, 128 and 130 are made of, for example, copper, tungsten or aluminum. The conductor layers 126, 128 and 130 are formed by a damascene process (e.g., a single damascene process).

Furthermore, a dielectric layer 132 is formed on the dielectric layer 124. The material and the method of forming the dielectric layer 124 may refer to those of the dielectric layer 116 described above.

Thereafter, a conductor layer 134 and a first electrode 136 are formed in the dielectric layer 132 and respectively connected with the conductor layer 130. Materials and methods of forming the conductor layer 134 and the first electrode 136 may refer to those of the conductor layers 118, 120 and 122 described above.

Figure 3B:
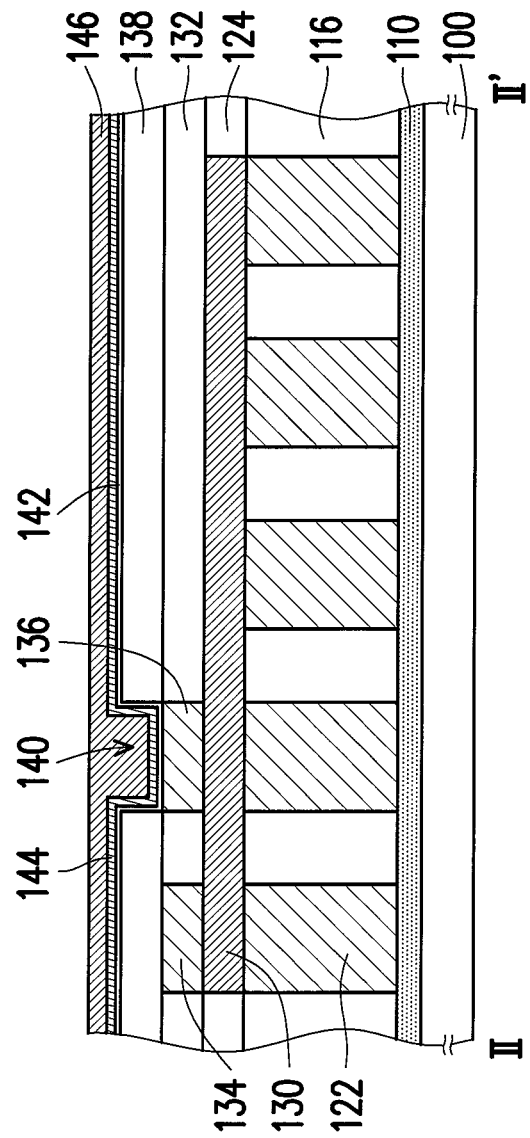

Next, referring to FIG. 1 and FIG. 3B, a dielectric layer 138 is formed on the dielectric layer 132. The material and the method of forming the dielectric layer 138 may refer to those of the dielectric layer 116 described above.

Then, an opening 140 is formed in the dielectric layer 138. The opening 140 is formed by, for example, performing a patterning process on the dielectric layer 138.

Next, a conformal insulation material layer 142 may be selectively formed in the opening 140. The material of the insulation material layer 142 is, for example, oxide, such as silicon oxide. The insulating material layer 142 may be formed by performing a CVD process.

Thereafter, a conformal variable resistance material layer 144 is formed on the insulation material layer 142. The material of the variable resistive material layer 144 is, for example, metal oxide, such as hafnium oxide, magnesium oxide, nickel oxide, niobium oxide, titanium oxide, aluminum oxide, vanadium oxide, tungsten oxide, zinc oxide or cobalt oxide. The variable resistance material layer 144 may be formed by performing a CVD process. In the present embodiment, forming the insulation material layer 142 before forming the variable resistance material layer 144 is taken as an example for description, while the disclosure is not limited thereto. In another embodiment, the insulation material layer 142 may also be formed after forming the variable resistance material layer 144.

Thereafter, a conductive material layer 146 filling up the opening 140 is formed. The conductive material layer 146 is made of, for example, copper, tungsten or aluminum. The conductive material layer may be formed by performing an electroplating process or a physical vapor deposition (PVD) process.

Figure 3C:
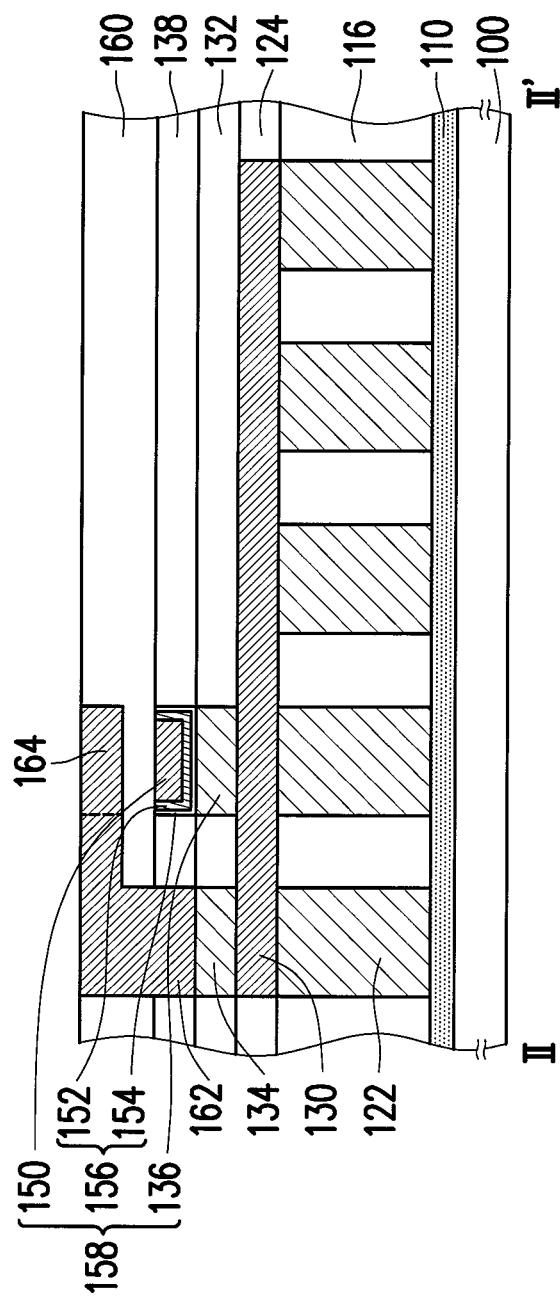

In addition, with reference to FIG. 1 and FIG. 3C, the conductive material layer 146, the variable resistance material layer 144 and the insulation material layer 142 outside the opening 140 are removed, so as to form a second electrode 150 (i.e., a part of the bit line 148), a variable resistance layer 152 and an insulation layer 154. The conductive material layer 146, the variable resistance material layer 144 and the insulation material layer 142 outside the opening 140 may be removed by performing a chemical mechanical polishing (CMP) process. The second electrode 150 illustrated in FIG. 3C is, for example, a part of the bit line 148 located above the first electrode 136. The variable resistance layer 152 and the insulation layer 154 may form a variable resistance structure 156. In case the variable resistance structure 156 includes the insulation layer 154, the variable resistance structure 156 may have an effect like a diode and thereby, effectively stop sneak current, so as to prevent disturb. The first electrode 136, the variable resistance structure 156 and the second electrode 150 may form a memory cell 158.

Next, a dielectric layer 160 is formed on the dielectric layer 138. The material and the method of forming the dielectric layer 160 may refer to those of the dielectric layer 116 described above.

Then, a conductor layer 162 is formed in the dielectric layers 160 and 138. The conductive layer 162 is made of, for example, copper, tungsten or aluminum. The conductor layer 162 is formed by, for example, a damascene process, such as by utilizing a dual damascene process or a plurality of single damascene processes. The part of the conductor layer 162 located above the second electrode 150 may serve as a first electrode 164.

Figure 3D:
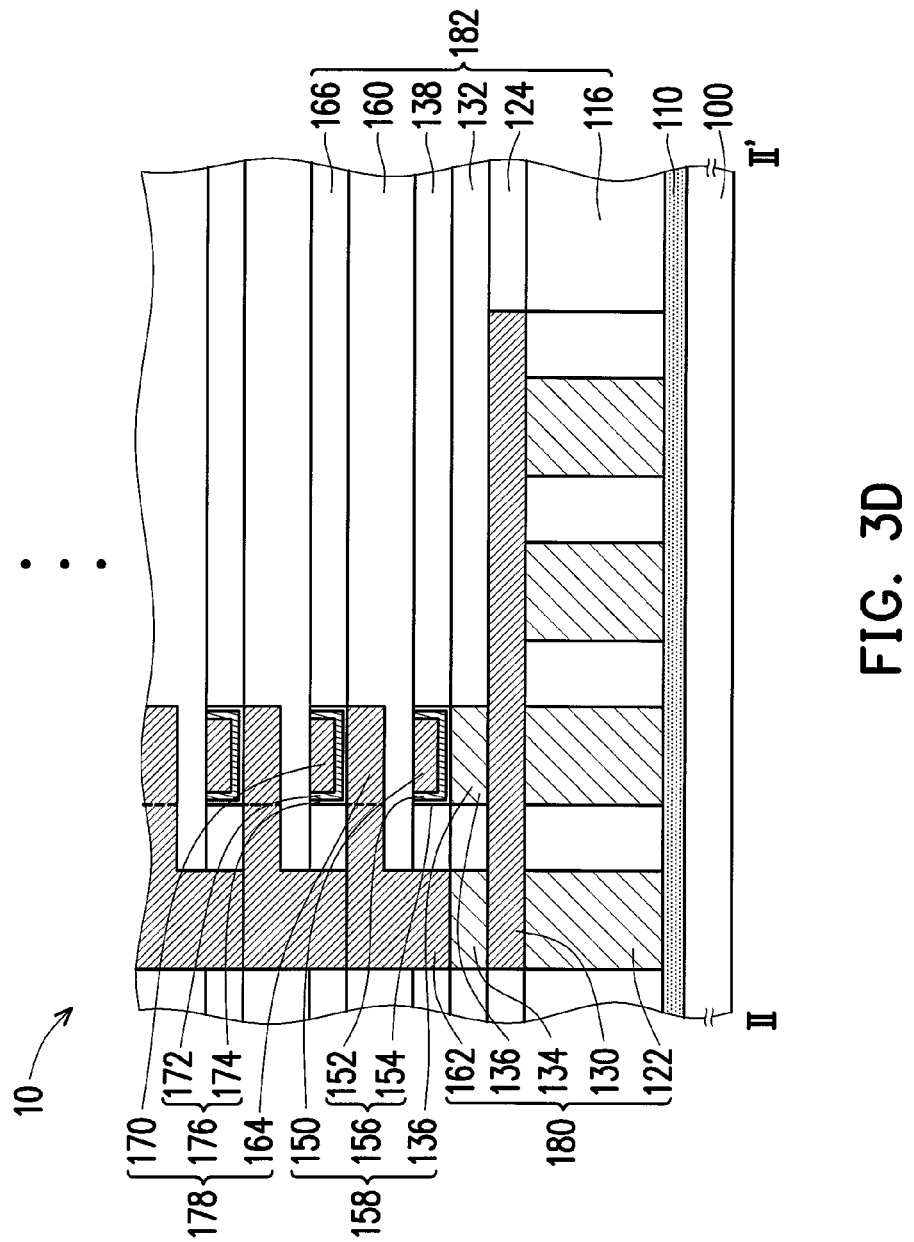

Next, referring to FIG. 1 and FIG. 3D, a dielectric layer 166 is formed on the dielectric layer 160. The material and the method of forming the dielectric layer 166 may refer to those of the dielectric layer 116 described above.

Thereafter, a second electrode 170 (i.e., a part of the bit line 168), a variable resistance layer 172 and an insulation layer 174 are formed in the dielectric layer 166. The second electrode 170 illustrated in FIG. 3D is, for example, a part of the bit line 168 located above the first electrode 164 illustrated in FIG. 1. The variable resistance layer 172 and the insulation layer 174 may form a variable resistance structure 176. The first electrode 164, the variable resistance structure 176 and the second electrode 170 may form a memory cell 178. Materials, forming methods and functions of the variable resistance structure 176 and the second electrode 170 may refer to those of the variable resistance structure 156 and the second electrode 150 described above.

In two vertically adjacent memory cells 158 and 178, the first electrode 164 of the upper memory cell 178 and the second electrode 150 of the lower memory cell 158 are disposed between the adjacent variable resistance structures 176 and 156 and isolated from each other. The first electrode 164 and the second electrode 150 may be isolated from each other by the dielectric layer 160.

Besides, the conductor layers 122, 130, 134, 162 and the first electrode 136 may form an interconnect structure 180. The interconnect structure 180 may connect the first electrodes 136 and 164 of the memory cells 158 and 178. In addition, the doped region 110 of the transistor 102 is connected with the interconnect structure 180, and thereby, the first electrodes 136 and 164 may be electrically connected to the doped region 110.

By means of the aforementioned manufacturing method, a basic structure of an RRAM 10 of a one transistor driving n resistive memory cells (1T-NR) is manufactured. Afterwards, the steps of forming the memory cell 178 may be repeated to form other memory cells and interconnect elements stacked on the memory cell 178 and further to form a plurality of 1T-NR RRAMs 10 on the substrate 100. In this way, a highly intensive RRAM array may be formed. Moreover, when the RRAM array have a plurality of 1T-NR RRAMs 10, distances between the 1T-NR RRAMs 10 may be narrowed down to the smallest to reduce a routing distance, such that a parasitic capacitance value may be reduce down the lowest level.

The structure of the resistive random access memory (RRAM) 10 of the present embodiment will be described with reference to FIGS. 1 and 3D hereinafter.

Referring to FIG. 1 and FIG. 3D together, the RRAM 10 includes a substrate 100, a dielectric layer 182, a plurality of memory cells (e.g., memory cells 158 and 178) and an interconnect structure 180. The RRAM 10 may further include a transistor 102. The transistor 102 is disposed on the substrate 100, and a doped region 102 (i.e., a terminal) of the transistor 102 is connected with the interconnect structure 108. In the present embodiment, the transistor 102 is a planar transistor as an example for illustration, but the invention is not limited thereto. In other embodiments, the transistor 102 may be a vertical transistor to further reduce an area occupied by the transistor 102 on a wafer, so as to increase space utilization.

The dielectric layer 182 is disposed on the substrate 100. In the present embodiment, the dielectric layer 182 is at least formed by dielectric layers 116, 124, 132, 138, 160 and 166, for example, but the invention is not limited thereto.

The memory cells 158 and 178 are vertically and adjacently disposed in the dielectric layer 182. The memory cell 158 includes a first electrode 136, a second second electrode 150 and a variable resistance structure 156. The variable resistance structure 156 includes a variable resistance layer 152 and may further selectively include an insulation layer 154 stacked with the variable resistance layer 152. The memory cell 178 includes a first electrode 164, a second electrode 170 and a variable resistance structure 176. The variable resistance structure 176 includes a variable resistance layer 172 and may further selectively include an insulation layer 174 stacked with the variable resistance layer 172. In addition, each of the first electrodes 136 and 164 may be a part of the interconnect structure 180.

In the two vertically adjacent memory cells 158 and 178, the first electrode 164 of the upper memory cell 178 and the second electrode 150 of the lower memory cell 158 are disposed between the adjacent variable resistance structures 176 and 156 and isolated from each other.

The interconnect structure 180 is disposed in the dielectric layer 182 and connects the first electrodes 136 and 164 of the memory cells 158 and 178.

Additionally, the RRAM 10 may further selectively include a source line 184. The source line 184 is made of, for example, copper, tungsten or aluminum. The source line 184 is formed by, for example, a damascene process. The source line 184 may be electrically connected to a conductor layer 128 by means of a plug 186.

In addition, the materials, dispositions, forming methods and functions of each of the elements of the RRAM 10 have been described in the manufacturing method with reference to FIG. 3A to FIG. 3D above and thus will not repeatedly described hereinafter.

Based on the embodiments described above, due to having the aforementioned structure, the RRAM 10 does not require a deep etching process or a deep filling process during the manufacturing process thereof. Thus, the manufacturing process of the RRAM 10 can be directly integrated with an advanced logic device manufacturing process.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A method of manufacturing a resistive random access memory, comprising:
    forming a dielectric layer on a substrate;
    forming a plurality of memory cells vertically and adjacently disposed in the dielectric layer, wherein each of the memory cells comprises:
        a first electrode;
        a second electrode, disposed on the first electrode; and
        a variable resistance structure, disposed between the first electrode and the second electrode, wherein
        in two vertically adjacent memory cells, the first electrode of the upper memory cell and the second electrode of the lower memory cell are disposed between the adjacent variable resistance structures and isolated from each other, and a method of forming the first electrodes comprises performing a damascene process; and
    forming an interconnect structure in the dielectric layer, wherein the interconnect structure connects the first electrodes of the memory cells.

2. The method of manufacturing the resistive random access memory according to claim 1, wherein a method of forming the dielectric layer comprises performing a chemical vapor deposition process.

3. The method of manufacturing the resistive random access memory according to claim 1, wherein a method of forming each of the variable resistance structures and each of the second electrodes comprises:
    forming an opening in the dielectric layer;
    forming a conformal variable resistance material layer in the opening;
    forming a conductive material layer filling up the opening; and
    removing the conductive material layer and the variable resistance material layer outside the opening.

4. The method of manufacturing the resistive random access memory according to claim 3, wherein a method of forming the opening comprises performing a patterning process on the dielectric layer.

5. The method of manufacturing the resistive random access memory according to claim 3, wherein a method of forming the variable resistance material layer comprises performing a chemical vapor deposition process.

6. The method of manufacturing the resistive random access memory according to claim 3, wherein a method of foaming the conductive material layer comprises performing an electroplating process or a physical vapor deposition process.

7. The method of manufacturing the resistive random access memory according to claim 3, wherein a method of removing the conductive material layer and the variable resistance material layer outside the opening comprises performing a chemical mechanical polishing process.

8. The method of manufacturing the resistive random access memory according to claim 3, wherein a method of forming each of the variable resistance structures further comprises forming a conformal insulation material layer before or after forming the variable resistance material layer.

9. The method of manufacturing the resistive random access memory according to claim 8, wherein a method of forming the insulation material layer comprises performing a chemical vapor deposition process.

10. The method of manufacturing the resistive random access memory according to claim 1, wherein a method of limning the interconnect structure comprises performing a damascene process.

11. The method of manufacturing the resistive random access memory according to claim 1, further comprising:
    before forming the dielectric layer, forming a transistor on the substrate, wherein a terminal of the transistor is connected with the interconnect structure.

* * * * *